United States Patent
Tobe et al.

(10) Patent No.: US 8,522,958 B2
(45) Date of Patent: Sep. 3, 2013

(54) VACUUM PROCESSING APPARATUS

(75) Inventors: Yasuhiro Tobe, Sendai (JP); Satoru Kawakami, Sendai (JP); Shinji Matsubayashi, Sendai (JP); Yosuke Muraguchi, Ise (JP); Yasuyoshi Kitazawa, Toyohashi (JP); Yasumichi Mieno, Toyohashi (JP)

(73) Assignees: Tokyo Electron Limited (JP); Sinfonia Technology Co., Ltd. (JP)

( * ) Notice: Subject to any disclaimer, the term of this patent is extended or adjusted under 35 U.S.C. 154(b) by 416 days.

(21) Appl. No.: 12/993,914

(22) PCT Filed: May 19, 2009

(86) PCT No.: PCT/JP2009/059178
§ 371 (c)(1),
(2), (4) Date: Nov. 22, 2010

(87) PCT Pub. No.: WO2009/142197
PCT Pub. Date: Nov. 26, 2009

(65) Prior Publication Data
US 2011/0076119 A1    Mar. 31, 2011

(30) Foreign Application Priority Data
May 20, 2008   (JP) ................................. 2008-131866

(51) Int. Cl.
*B65G 49/00*   (2006.01)
*B65G 54/02*   (2006.01)

(52) U.S. Cl.
USPC ............ 198/619; 414/217; 414/939; 118/729

(58) Field of Classification Search
USPC ................. 198/619; 118/728, 729; 414/217, 414/217.1, 939
See application file for complete search history.

(56) References Cited

U.S. PATENT DOCUMENTS

| | | | | |
|---|---|---|---|---|
| 6,935,828 | B2 * | 8/2005 | Ackeret et al. ................ | 414/217 |
| 7,825,455 | B2 * | 11/2010 | Lee et al. ...................... | 257/315 |
| 7,841,820 | B2 * | 11/2010 | Bonora et al. ............. | 414/217.1 |
| 7,988,398 | B2 * | 8/2011 | Hofmeister et al. .......... | 414/217 |
| 8,177,048 | B2 * | 5/2012 | Sato et al. ..................... | 198/619 |
| 2010/0043712 | A1 * | 2/2010 | Tobe et al. .................... | 118/728 |

FOREIGN PATENT DOCUMENTS

| | | |
|---|---|---|
| JP | 64-050750 | 2/1989 |
| JP | 02-198920 | 8/1990 |
| JP | 4-28622 | 1/1992 |
| JP | 6-179524 | 6/1994 |
| JP | 07-079507 | 3/1995 |
| JP | 2000-68219 | 3/2000 |
| JP | 2001-112223 | 4/2001 |
| JP | 2002-059386 | 2/2002 |
| JP | 2005-317656 | 11/2005 |
| WO | WO 2005/106944 A1 | 4/2005 |

* cited by examiner

Primary Examiner — Mark A Deuble
(74) *Attorney, Agent, or Firm* — Berliner & Associates

(57) ABSTRACT

An object is to provide a vacuum processing apparatus that is capable of suppressing the costs and making control easy. Provided is a vacuum processing apparatus that includes a vacuum section (2) of which inside is held in vacuum, a placing section (3) that is disposed inside the vacuum section (2) and is capable of placing a workpiece thereon, a linear motor 4) that includes coils (415) and makes the placing section (3) travel within the vacuum section, wherein air is placed inside the placing section (3) while being isolated from the vacuum section (2), and the coils (415) of the linear motor (4) are disposed inside the placing section (3).

9 Claims, 8 Drawing Sheets

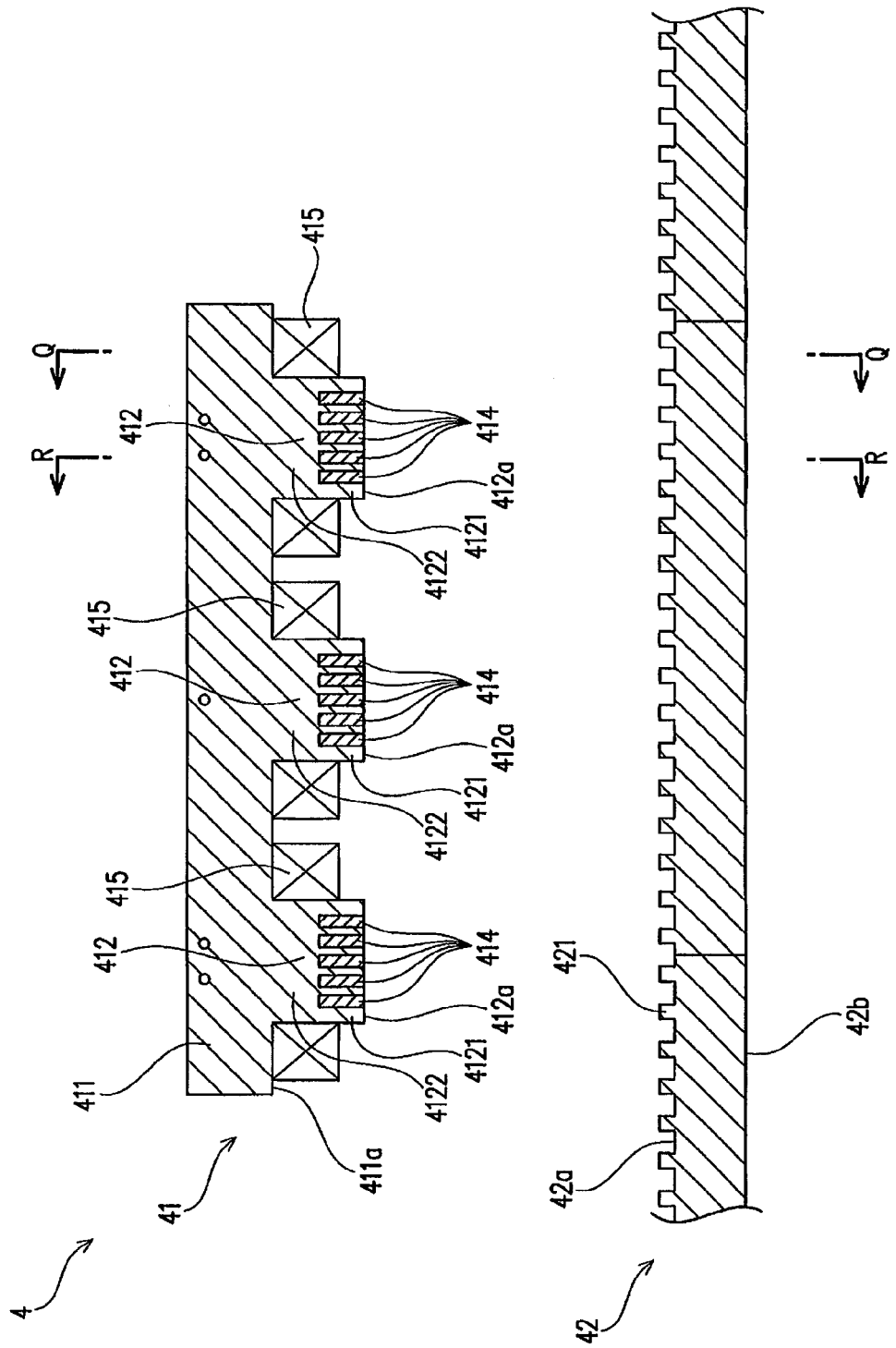

VACUUM PROCESSING APPARATUS

FIELD OF THE INVENTION

The present invention relates to a vacuum processing apparatus that is capable of applying a predetermined process under vacuum to workpieces, such as wafers and glass substrates.

RELATED ART

Hitherto, a known vacuum processing apparatus of the above type includes a vacuum section, of which inside is held in vacuum, a placing section that is disposed inside the vacuum section and is capable of placing a workpiece thereon, and a linear motor that makes the placing section travel within the inside of the vacuum section.

This vacuum processing apparatus can apply a predetermined process to a workpiece under vacuum by placing a workpiece on the placing section and activating the linear motor.

The linear motor for making the placing section travel may generate heat from, such as coils mounted therein. In a case where the coils are provided with an insulating varnish or a protecting mold, they may generate gas because these varnish and mold are generally made of resin.

These heat and gas may cause an adverse effect to the workpiece or make the vacuum conditions inside the vacuum section unstable. Therefore, in a conventional vacuum processing apparatus, the linear motor is installed outside the vacuum section to prevent heat or gas generated from the linear motor from being released into vacuum, which is inside the vacuum section (cf., the following Patent Document 1).

PRIOR ART DOCUMENTS

Patent Documents

Patent Document 1: Japanese Patent Application Laid-open No. Hei-6-179524

DISCLOSURE OF THE INVENTION

Problems to be Solved by the Invention

The aforesaid conventional vacuum processing apparatus, which is structured to make the placing section travel while having the linear motor installed outside the vacuum section, requires a large number of linear motors (especially coils) to be installed along the entire traveling path of the placing section within the vacuum section, and hence requires costs.

The structure with a large number of coils installed adjacent to each other necessitates adjustment of electric current to be flown into the respective coils according to the position of the placing section in order to make the placing section travel, and hence necessitates complicated control.

In consideration of the above reasons, it is an object of the present invention to provide a vacuum processing apparatus that is capable of suppressing costs and making control easy.

Means for Solving Problems

According to the present invention, which was conceived to solve the above problem, there is provided a vacuum processing apparatus that includes a vacuum section of which inside is held in vacuum, a placing section that is disposed inside the vacuum section and is capable of placing a workpiece thereon, and a linear motor that includes coils and makes the placing section travel within the vacuum section, wherein air is placed inside the placing section while being isolated from the vacuum section, and the coils of the linear motor are disposed inside the placing section.

In the vacuum processing apparatus having the above structure, the coils of the linear motor are disposed inside the placing section where air is placed, so that heat generated from the coils is not released to the inside the vacuum section held in vacuum, but released to air inside the placing section. For example, when an insulating varnish or protection mold is provided on the coils, gas generated from the varnish or mold is released to not the inside the vacuum section but air inside the placing section. Therefore, no adverse effect is caused to the workpiece placed on the placing section, and the inside the vacuum section can be held in stable vacuum conditions.

The coils travel along with the placing section since they are provided inside the placing section. As such, it is not necessary to provide a large number of coils along the entire traveling path of the placing section unlike the prior art, and therefore the number of coils to be installed can be suppressed. Since the coils travel along the placing section, it is not necessary to perform complicated control, that is, adjust the electric current to be flown into each coil according to the position of the placing section by preparing a large number of coils.

Especially, it is preferable to employ the structure where the placing section includes a placing body that has a placing surface for placing the workpiece thereon and a cover that is mounted to the placing body so as to project outward from the placing body, and the coils are housed inside the cover.

The cover is preferably made of a non-magnetic material.

It is preferable to employ the structure where the placing section includes a placing body that has a placing surface on which the workpiece is placed; the placing body has a wide portion that has a top surface acting as the placing surface and a narrow portion that projects downward from a bottom surface of the wide portion and has a lateral width smaller than the lateral width of the wide portion; the linear motor is provided in pair corresponding to the lateral side surfaces of the narrow portion; and both the pair of linear motors are placed within the range of the lateral width of the wide portion.

According to the above structure, since the lateral or right and left width of the narrow portion is smaller than the lateral or right and left width of the wide portion, spaces are formed on the lower side of the wide portion and on both the lateral sides of the narrow portion and therefore the linear motors can be disposed in these spaces, which enables themselves to be placed within the range of the lateral width of the wide portion. Thus, there is an advantageous effect of making it possible to achieve the compactness of the apparatus while securing the size or dimension of the placing surface.

Furthermore, it is preferable to employ the structure where the apparatus further includes rails that support the placing section and guide the placing section along a traveling path thereof, wherein the linear motor has a permanent magnet and is disposed so that the attraction force of the permanent magnet acts in a direction crossing the direction of the gravity acting on the placing section.

According to the above structure, since the gravity direction component of the attraction force of the permanent magnet acting on the linear motor becomes small, it is possible to reduce the load applied onto the rails, and hence increase the durability of the rails. Occurrence of particles can also be suppressed. The gravity direction acting on the placing section is a vertically downward direction.

It is preferable to employ the structure where the apparatus further includes rails that support the placing section and guide the placing section along a traveling path thereof, wherein the linear motor is provided in plural, each of the linear motors having a permanent magnet, and the linear motors are disposed so that the attraction forces of the permanent magnets of the linear motors are balanced out and eliminated.

It is also preferable to employ the structure where the linear motor includes a first core that has the coils and a second core that is disposed along the traveling path of the placing section; any one of the first core and the second core has a permanent magnet; the linear motor is disposed so that the first core and the second core laterally oppose each other; and the linear motor is provided in pair to laterally oppose each other relative to the traveling direction.

According to the above structure, the attraction force of the permanent magnet acting between the first core and the second core acts in the lateral direction, and the attraction force acting on one of the linear motors and the attraction force acting on the other linear motor act in the opposite directions, respectively. Thus, the attraction forces acting on the linear motors are balanced out and eliminated, so that the load applied to the rails can be reduced and the forces acting on the placing section can be easily balanced.

It is also preferable to employ the structure where an area outside the vacuum section is an atmospheric area, and a communication section is provided to communicate between the atmospheric area and the inside the placing section. With this, heat generated from the coils disposed inside of the placing section can be released to the atmospheric area or the coils can be cooled from the outside, so that increase in temperature inside the placing section or temperature of the coils can be effectively suppressed. For example, when the coils are provided with the varnish or mold, gas generated from the varnish or mold can be released to the atmospheric area outside the vacuum section through the communication section.

In addition, wires or the like required for the linear motor (s) can be installed from the inside the placing section to the atmospheric area outside the vacuum section through the communication section.

The communication section is preferably provided on any one or both of the lateral (right and left) sides relative to the traveling path of the placing section. This enables the placing section to travel throughout the entire length in the traveling direction of the placing section within the vacuum section, which produces an advantageous effect of enabling the vacuum section to be of the compact size.

When the communication sections are disposed on the opposite lateral sides relative to the traveling path, it is possible to flow air, for example, from the left communication section to the right communication section through the placing section, and therefore effectively process heat or gas generated inside the placing section.

Furthermore, the communication section is preferably an extendable multiple joint arm duct that extends and contracts in the traveling direction of the placing section and that extends and contracts in the traveling direction of the placing section by extension and contraction of joints in association with the travel of the placing section.

Advantages of the Invention

Thus, in the vacuum processing apparatus of the present invention, the coils of the linear motor(s) are disposed inside the placing section, which allows the coils to travel along with the placing section. This enables suppression of the number of coils, and elimination of complicated control for the linear motor(s), which results in suppression of the costs and making the control easier.

BRIEF DESCRIPTION OF THE DRAWINGS

FIG. 4 are cross sectional views as viewed from the front side of a linear motor provided in the vacuum processing apparatus.

FIG. 5 are views showing cross sectional shapes of the linear motor, in which

FIG. 6 are views showing the mounting states of the linear motor, in which

FIG. 7 are views showing another embodiment relating to the mounting manner of a second core of the linear motor, in which

DETAILED DESCRIPTION OF THE PREFERRED EMBODIMENT

Now, the description will be made for a vacuum processing apparatus of one embodiment of the present invention with reference to the drawings attached hereto.

Figure 1:
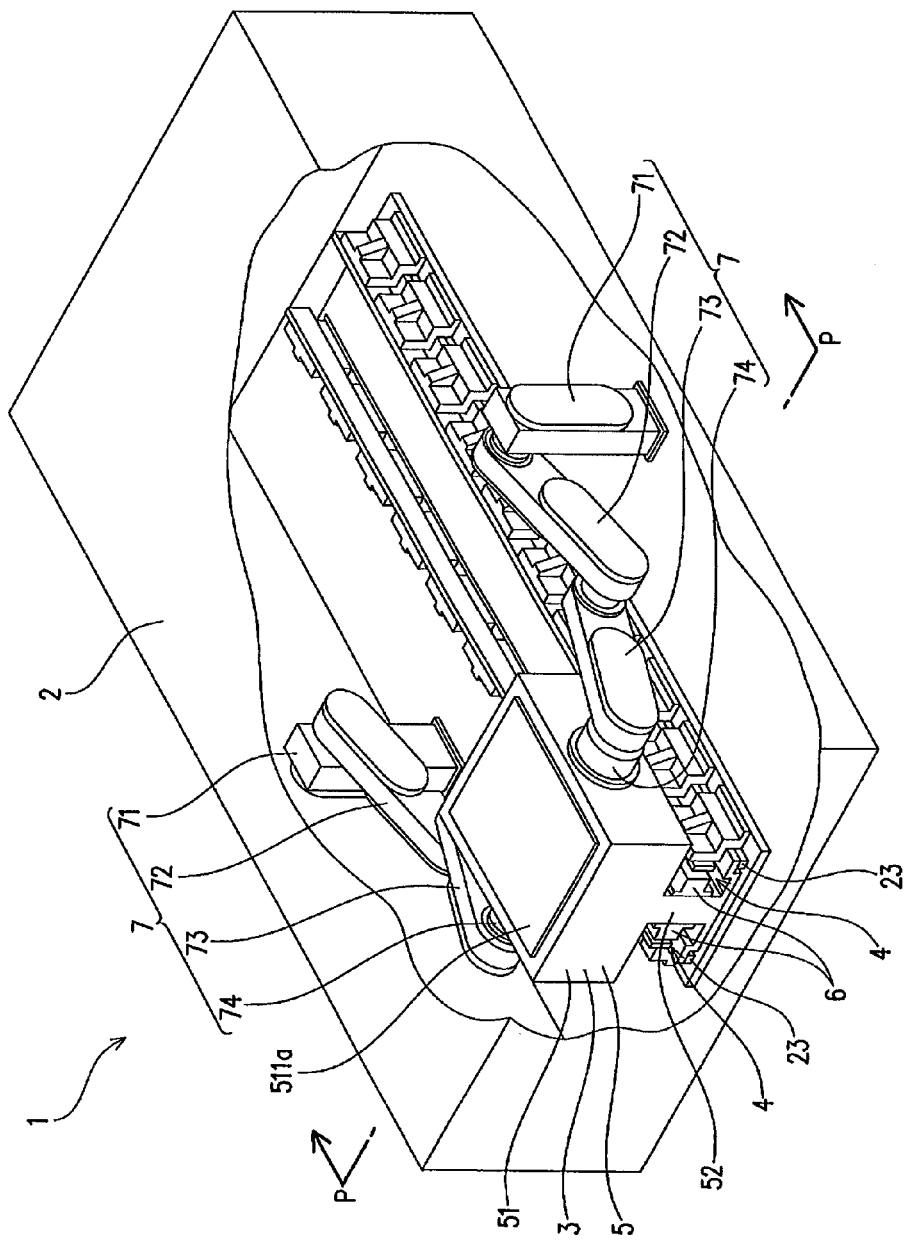
FIG. 1 is a perspective view showing a vacuum processing apparatus according to one embodiment of the present invention.

FIG. 1 shows a vacuum processing apparatus 1 of this embodiment. The vacuum processing apparatus 1 includes a vacuum section 2 of which inside is held in vacuum, a placing section 3 that is disposed inside the vacuum section 2 and is capable of placing a workpiece (not shown) to be treated thereon, and first cores 41 of linear motors 4 for making the placing section 3 travel within the inside the vacuum section 2. The vacuum processing apparatus 1 is designed to be capable of applying a predetermined process to a workpiece, such as a wafer or a glass substrate while at the same time making it travel under vacuum. By the predetermined process is herein meant to contain a variety of processes, such as a conveying process and a film forming process.

Figure 2:
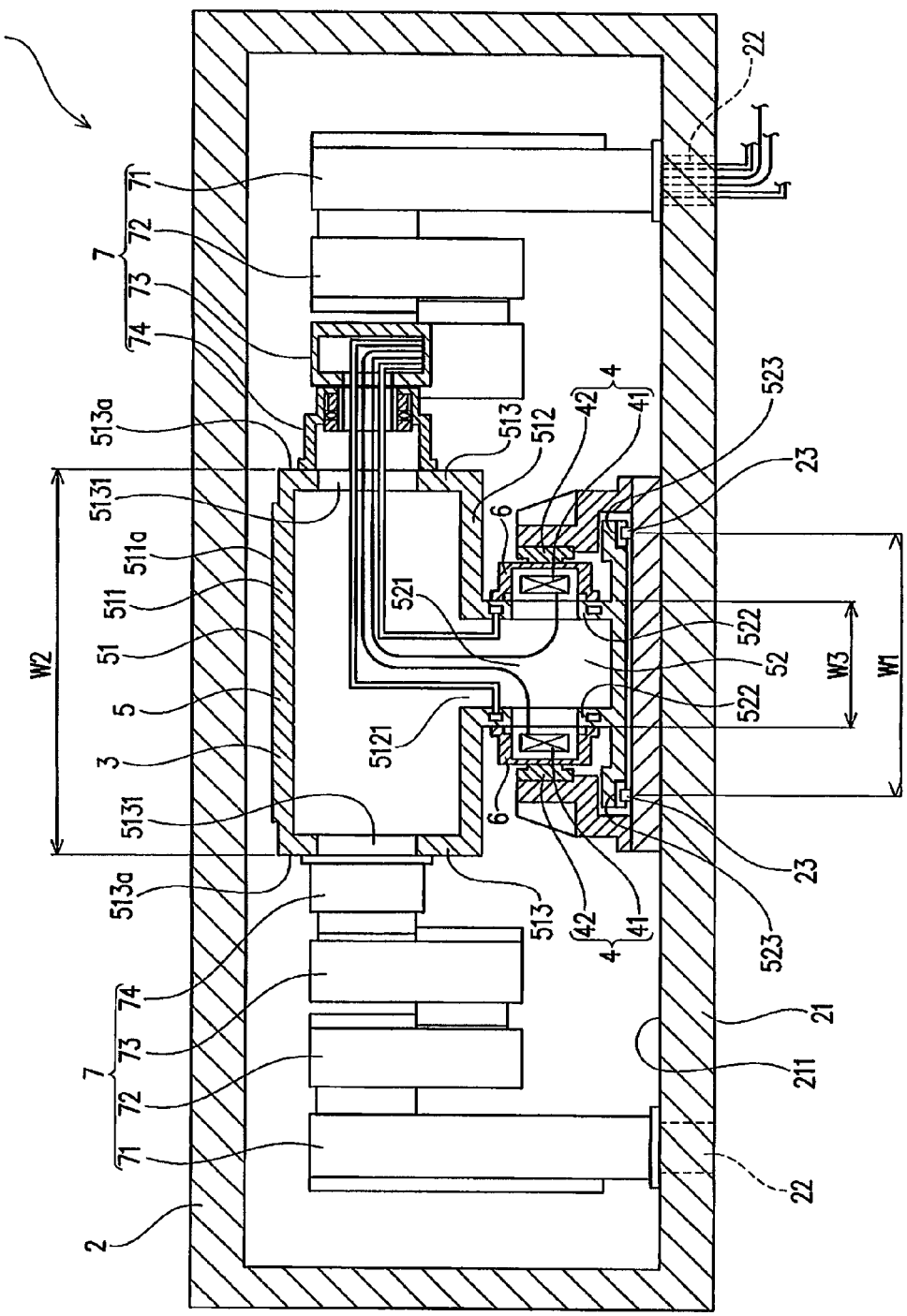
FIG. 2 is a cross sectional view taken along a line P-P in FIG. 1.

The vacuum section 2 is a hollowed housing having a rectangular parallelepiped shape and is designed to be capable of holding the inside thereof in vacuum, as shown in FIGS. 1 and 2. The outside of the vacuum section 2 is an atmospheric area. In the vacuum section 2, a bottom wall 21, which forms a bottom surface of the housing, is oriented parallel to the horizontal plane. An inner surface 211 of the bottom wall 21, that is, a bottom surface within the inside the vacuum section 2 is of a flat surface parallel to the horizontal plane. In this embodiment, the bottom wall 21 has a pair of first communication holes 22, which extend through the bottom wall 21 from the inner surface to the outer surface, are respectively formed at the lateral or right and left sides.

The inside the vacuum section 2 is provided with rails 23 that together support the placing section 3. Specifically, the rails 23 are formed on the inner surface 211 of the bottom wall 21 along the longitudinal direction (front and back direction) and provided in pair parallel to each other at the lateral sides. In this embodiment, the rails 23 are formed throughout the entire length in the longitudinal direction of the vacuum section 2, and are disposed between the laterally disposed first communication holes 22. In other words, the laterally disposed first communication holes 22 are disposed to have a distance therebetween being greater than the lateral spacing distance W1 of the pair of rails 23 so as to be disposed laterally outward of the rails 23. By the longitudinal direction (right and left direction) is herein meant a direction crossing the lateral direction (width direction) on the horizontal plane, and a direction along which the placing section 3 travels.

As shown in FIGS. 1 and 2, the placing section 3 is structured so as to linearly travel within the inside the vacuum section 2 while having a workpiece to be treated placed thereon. The placing section 3 is a hollowed housing smaller than the vacuum section 2, and is designed to be capable of placing air therein. The placing section 3 has a top surface that is formed in flat allowing itself to place a workpiece thereon, and is structured so as to allow the linear motors 4 to be disposed on lower ends thereof. The placing section 3 includes a placing body 5 that has a placing surface 511a for placing a workpiece thereon, and covers 6 that are mounted to the placing body 5.

The placing body 5 is of a hollowed housing, having a wide portion 51 that has a top surface acting as the placing surface 511a and a narrow portion 52 that projects downward from the bottom surface of the wide portion 51. In this embodiment, the lateral width W2 of the wide portion 51 is greater than the lateral spacing distance W1 of the pair of rails 23, and the lateral width W3 of the narrow portion 52 is smaller than the lateral spacing distance W1 of the pair of rails 23.

The wide portion 51 is of a hollowed housing having a rectangular parallelepiped shape. The outer surface of an upper wall 511 of the wide portion 51 (i.e., the top surface of the wide portion 51) is formed in flat acting as the placing surface 511a for placing a workpiece thereon. A lower wall 512 of the wide portion 51 is oriented parallel to the upper wall 511, and has a through-hole 5121 substantially at the center in the lateral direction, which extends through the lower wall 512 from the inner surface to the outer surface.

Lateral side walls 513 of the wide portion 51 are oriented parallel to each other, and outer surfaces 513a of the lateral side walls 513 (i.e., lateral side surfaces of the wide portion 51) each are of a flat surface. The lateral side walls 513 respectively have second communication holes 5131 that extend therethrough from the outer surface to the inner surface, and the insides the wide portion 51 are communicated to the outside through the respective second communication holes 5131.

On the other hand, the narrow portion 52 is of a hollowed housing having a rectangular parallelepiped shape. The lateral width W3 of the narrow portion 52 is smaller than the lateral width W2 of the wide portion 51. The entire area of the upper end of this narrow portion 52 defines an opening 521 that opens upward.

The narrow portion 52 includes a pair of side walls 522 that laterally oppose each other, and outer surfaces 522a of the respective side walls 522 (i.e., lateral side surfaces of the narrow portion 52) each are of a flat surface and are oriented parallel to each other. The distance between the lateral side walls 522 is substantially in conformity with the lateral width of the through-hole 5121 of the wide portion 51. Thus, the lateral width of the opening 521 is substantially equal to the lateral width of the through-hole 5121 of the wide portion 51. The lateral side walls 522 respectively have mounting holes 5221 for mounting the linear motors 4. The mounting holes 5221 each extend through the corresponding side wall 522 from the outer surface to the inner surface.

The lower ends of the narrow portion 52 are respectively provided with rail engaging portions 523 that are engageable with the rails 23. Specifically, the rail engaging portions 523 are disposed in pair on the lateral sides and project outward in the lateral direction from the lower ends of the corresponding side walls 522 of the narrow portion 52.

The side walls 522 of the narrow portion 52 respectively have fluid passages 5222 for communication of cooling medium, such as cooling liquid and cooling gas. These communication passages 522 are embedded inside the side walls 522 and may be provided by, for example, embedding pipes in the side walls 522.

The narrow portion 52 projects downward from substantially the center area in the lateral direction of the bottom surface of the wide portion 51. Specifically, the narrow portion 52 are provided so that, with the opening 521 of the upper end matched in position to the through-hole 5121 formed in the lower wall 512 of the wide portion 51, the side walls 522 project downward from the lower wall 512 of the wide portion 51. Thus, the inside the wide portion 51 is held in communication with the inside the narrow portion 52.

Figure 3:
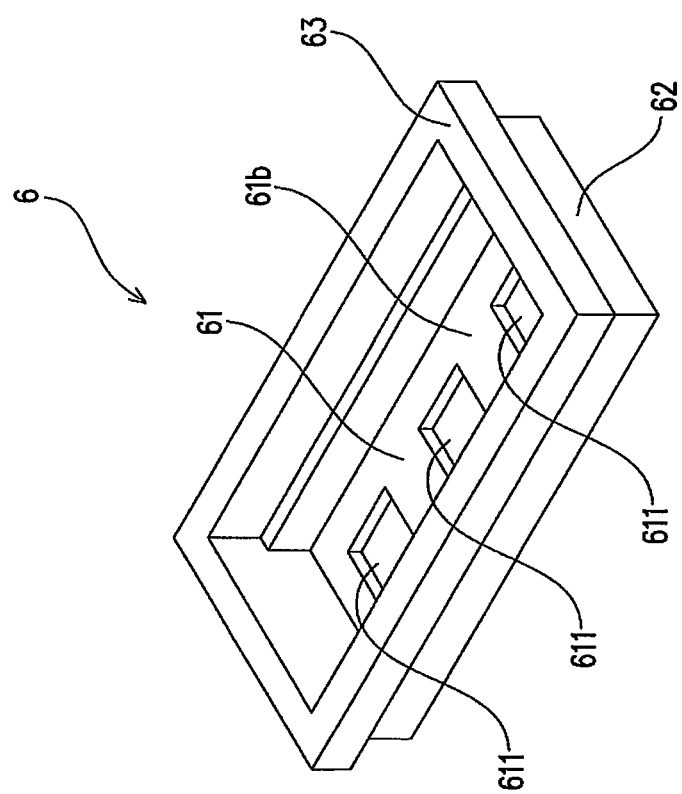
FIG. 3 is a perspective view showing a cover provided in the vacuum processing apparatus.

On the other hand, the covers 6 mounted to the placing body 5 each are of a bottomed container shape that is capable of covering the corresponding mounting hole 5221 of the narrow portion 52. Specifically, as shown in FIG. 3, the cover 6 includes a plate shaped bottom wall 61 that defines a bottom of a container shape, an outer wall 62 that is disposed along the entire periphery of the bottom wall 61, and a flange 63 that is formed along an outer end of the outer wall 62. An area surrounded by the bottom wall 61 and the outer wall 62 is an inside area of each of the covers 6. The size or dimension of the insides each of the covers 6 is substantially equal to the size or dimension of the mounting holes 5221 of the narrow portion 52.

Each cover 6 comprises a non-magnetic material, and is made of, for example, a non-magnetic material, such as resin (e.g., epoxy resin or the like) that releases less gas even in vacuum, glass, ceramics, metal (e.g., aluminium, stainless steel or the like), or a weak magnetic material. When the cover 6 is made of a magnetic material, leakage of magnetic flux is caused; however when the cover 6 is made of a non-magnetic material, such leakage of magnetic flux may be suppressed. The material of the cover 6 is preferably a material having a large electric resistivity (i.e., a material having a small conductive rate), of non-magnetic materials. With these materials, an overcurrent generated in the cover 6 may be reduced and hence there is an advantageous effect in that the linear motors 4 can be effectively driven.

The bottom wall 61 has an outer surface 61a that is a flat surface, while having an inner surface 61b that is an uneven surface. Specifically, the inner surface 61b of the bottom wall 61 has recesses 611 that are recessed toward the outer surface 61a. In this embodiment, the recesses 611 are provided in plural with a predetermined interval therebetween along the longitudinal axis of the bottom wall 61.

The thus formed covers 6 are mounted to the placing body 5 so as to project outward from the placing body 5. Specifically, the covers 6 are detachably mounted to the placing body 5 so as to close the mounting holes 5221 that are bored in the placing body 5 for mounting the linear motors 4 therein.

More specifically, the covers 6 each are detachably mounted to the side walls 522 by abutting the flange 63 to the outer surface 522a of the side wall 522 of the narrow portion 52 to close the mounting hole 5221 formed in the narrow portion 52, and then fixing it by a bolt or the like. With the covers detachably mounted to the placing body 5, the covers 5 can be washed after they are detached from the placing body 5, so that particles can be removed by removing film adhered thereto in chemical vapor deposition (CVD) when forming film. In this embodiment, a seal member such as an O-ring is disposed between the outer surface 522a of the side wall 522 of the narrow portion 52 and the flange 63. With this seal member, a gap between the inside the placing section 31 and the inside the vacuum section 2 is hermetically sealed.

In this mounting state of each cover 6, the bottom wall 61 extends vertically relative to the placing surface 511a. The projecting amount of the cover 6 is smaller than the projecting amount of the rail engaging portion 523, and thus the bottom wall 61 of the cover 6 is located laterally inward of the rail engaging portion 523. The covers 6 are provided in pair corresponding to the lateral side walls 522 of the narrow portion 52.

The placing section 3 that includes the placing body 5 and the covers 6 is disposed inside the vacuum section 2. Specifically, as shown in FIGS. 1 and 2, the placing section 3 is installed on the rails 23 so as to allow the rail engaging portions 523 provided in the narrow portion 52 to be engaged with the rails 23 of the vacuum section 2. Whereby, the rails 23 together support the placing section 3 so that the placing section 3 can travel in the longitudinal direction within the inside the vacuum section 2 along the rails 23. In this installing state, the rails 23 on the lateral sides are located correspondingly in position to both the lateral ends of the placing surface 511a.

The inside the placing section 3 and the atmospheric area outside the vacuum section 2 are communicated with each other via communication sections 7. The communication sections 7 are structured to allow air to be communicated therethrough, and are disposed inside the vacuum section 2, in which one end and another end of each of the communication sections 7 are connected a first communication hole 22 of the vacuum section 2 and a second communication hole 5131 of the placing section 3, respectively. In this embodiment, the communication sections 7 are provided in pair along the longitudinal direction, that is, the traveling direction of the placing section 3. Conduits relating to the fluid passages 5222 embedded in the side walls 522 of the narrow portion 52 are disposed so as to extend through the insides of the communication sections 7 to the outside the vacuum section 2.

In this embodiment, the communication sections 7 each comprise an extendable multiple joint arm duct that extends and contracts in the traveling direction of the placing section 3, and specifically extends and contracts in the traveling direction upon extension and contraction of the joints in association with the travel of the placing section 3. Specifically, as shown in FIGS. 1 and 2, the communication sections 7 each include a first arm 71 that is fixed in standing position on the inner surface 211 of the bottom wall 21 of the vacuum section 2 so as to cover the first communication hole 22 of the vacuum section 2, a second arm 72 that has one end pivotally supported at an end of the first arm 71, and a third arm 73 that has one end pivotally supported at another end of the second arm 72. The communication sections 7 each have another end of the third arm 73 being pivotally supported to an arm coupling part 74 to be coupled to the wide portion 51, in which the arm coupling part 74 is fixedly mounted to the lateral surface of the wide portion 51 so as to cover the second communication hole 5131 formed in the wide portion 51.

In each communication section 7, the second arm 72 and the third arm 73 pivotally move relative to each other along the vertical plane parallel to the longitudinal direction (front and back direction) allowing the relative angle therebetween to become small when the placing section 3 travels along the rails 23 allowing the distance between the placing section 3 and the first arm 71 to become small, and on the other hand, the second arm 72 and the third arm 73 pivotally move relative to each other along the vertical plane parallel to the longitudinal direction (front and back direction) allowing the relative angle therebetween to become large when the placing section 3 travels along the rails 23 allowing the distance between the placing section 3 and the first arm 71 to become large. Coupling portions of the first to third arms 71-73, and the arm coupling part 74 function as joints of each of the communication sections 7, and the coupling portions each are provided with a ferrofluidic seal, an O-ring or a shaft seal as a rotary seal.

In this embodiment, the communication sections 7 extend and contract through only the areas located lower than the placing surface 511a of the placing section 3. That is, the coupling portions are entirely located lower than the placing surface 511a, and the pivotal motion of the second arm 72 and the third arm 73 is made in an area lower than the placing surface 511a.

With the communication sections 7, the inside the vacuum section 2 is spatially isolated from both the atmospheric area outside the vacuum section 2 and the inside the placing section 3, and on the other hand, the inside the placing section 3 is communicated with the atmospheric area outside the vacuum section 2. Thus, it is possible to hold the inside the vacuum section 2 in vacuum and allow the inside the placing section 3 to place air therein.

Figure 5A:
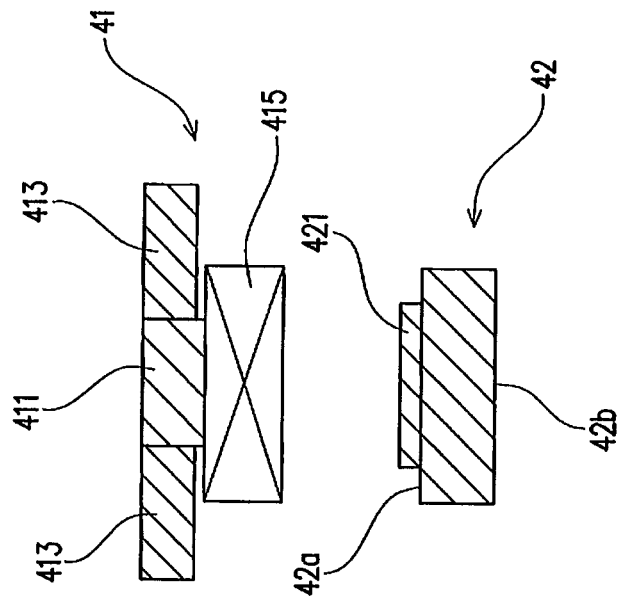
FIG. 5(A) is a cross sectional view taken along a line Q-Q in FIG. 4
Figure 5B:
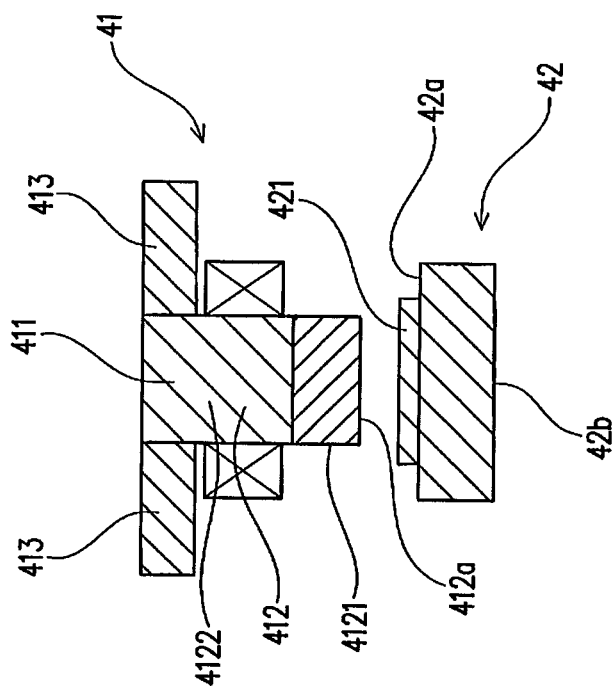
FIG. 5(B) is a cross sectional view taken along a line R-R in FIG. 4.

The linear motors 4 are designed to generate driving power for making the placing section 3 travel within the inside the vacuum section 2 by utilizing magnetic force, and, in this embodiment, are guided threaded-type linear motors that are driven by utilizing the electromagnetic action. The linear motors 4 each include a first core 41 that has permanent magnets 414 and coils 415, and a second core 42 that is made of a magnetic material, as shown in FIG. 4 and FIGS. 5(A) and 5(B).

The first core 41 includes a yoke 411 that acts as a magnetic path and magnetic poles 412 that project from the yoke 411. The yoke 411 has a plate shaped body having a uniform width that is formed in straight in the longitudinal direction. The magnetic poles 412 project from a front surface 411a of the yoke 411 toward the outside (in the thickness direction of the yoke 411 in this embodiment). The magnetic poles 412 are provided in plural with a predetermined interval therebetween along the longitudinal axis of the yoke 411, and the projecting directions of them are the same as each other. In this embodiment, the yoke 411 and the magnetic poles 412 are integrally formed and made of, for example, a magnetic material such as iron. On the opposite sides in the width direction of the yoke 411 are disposed supporting parts 413 for supporting the yoke 411.

The magnetic poles 412 are provided at their ends 4121 (more specifically leading ends 4121 in the projecting direction) with permanent magnets 414, around which coils 415 are formed. Specifically, the permanent magnets 414 are provided in plural at and embedded in each of the leading ends 4121 of the magnetic poles 412, and are disposed side by side in the longitudinal direction of the yoke 411 with a predetermined interval in the longitudinal direction. These permanent magnets 414 are exposed to the outside through leading end surfaces 412*a* of the magnetic poles 412 so as to be flush with these leading end surfaces 412*a*. The arrangement of the permanent magnets 414 may be employed from those disclosed in, for example, Japanese Examined Patent Application Publication No. Hei-07-059144.

On the other hand, the coils 415 are disposed relative to the magnetic poles 412, respectively, and each are formed by winding copper wire around the projecting direction of the magnetic poles 412. The coils 415 are disposed at a base end 4122 (more specifically, a base end 4122 in the projecting direction) of each magnetic pole 412, and are held in abutting engagement with the surface 411*a* of the yoke 411 in this embodiment. The leading ends 4121 of the magnetic poles 412 project outward of the coils 415. The coils 415 may be provided with an insulating varnish or a protection mold.

The second core 42 is of a plate shaped body having a uniform width that is formed in straight in the longitudinal direction, and has projections 421 that project in the thickness direction towards the front surface 42*a*. The projections 421 are formed along the width direction of the second core 42 and are disposed in plural with a predetermined interval therebetween in the longitudinal direction of the second core 42. Specifically, the projections 421 are formed in plural so as to have an interval therebetween in the direction along the longitudinal direction of the second core 42 being around twice as much as the interval between the permanent magnets 414 embedded in each of the magnetic poles 412. That is, the front surface 42*a* of the second core 42 is an uneven surface, while the rear surface 42*b* of the second core 42 is a flat surface. The second core 42 is made of, for example, a metal having a magnetic property, such as iron and magnetic stainless steel. In this embodiment, the second core 42 is made of iron, and is formed by subjecting the iron to, for example, electroless nickel plating as surface treatment. By this surface treatment, rusting of the second core 42 can be prevented, and furthermore, releasing of gas into the inside the vacuum section 2 can be effectively suppressed. The front surface 42*a* (i.e., the uneven surface) of the second core 42 is subjected to surface treatment so as to have a smaller surface roughness and hence a small surface area, which enables further suppression of gas releasing. The angle portions of the leading ends of the projections 421 are subjected to rounding process so as to decrease so-called plating pinholes. The second core 42 may be of a laminated structure, in which metals having a magnetic property are laminated together to have a laminate which is coated with an epoxy resin for rust proofing. With this structure, the performance of the linear motors 4 can be improved.

The first cores 41 and the second cores 42 of the linear motors 4 are disposed at a position inside the placing section 3, and at a position outside the placing section 3 and inside the vacuum section 2, respectively. Specifically, the linear motors 4 are disposed in the narrow portion 52, and are entirely placed within the range of the lateral width W2 of the wide portion 51 and placed within the area between the lateral (right and left sided) rails 23.

Figure 6A:
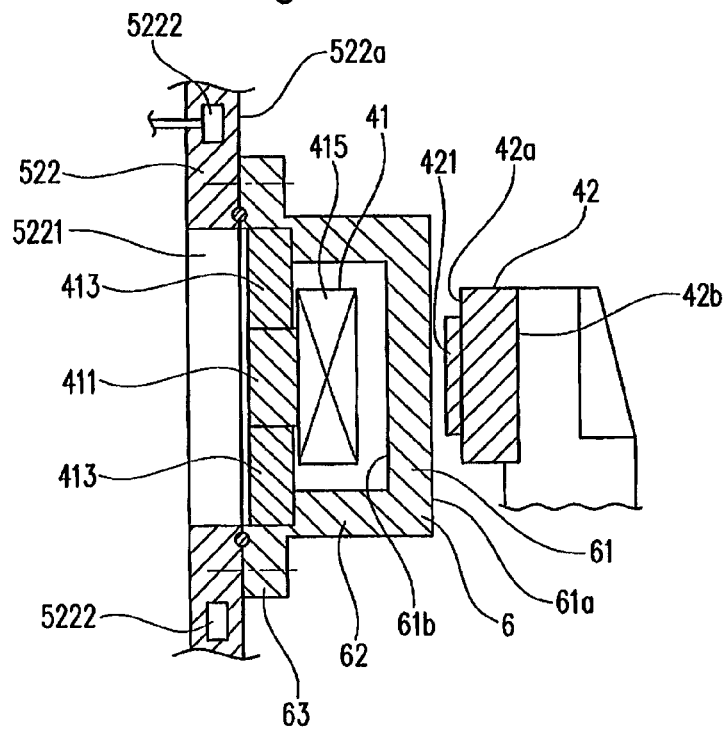
FIG. 6(A) is a cross sectional view showing the arrangement of a coil and FIG. 6(B) is a cross sectional view showing the arrangement of a magnetic pole.
Figure 6B:
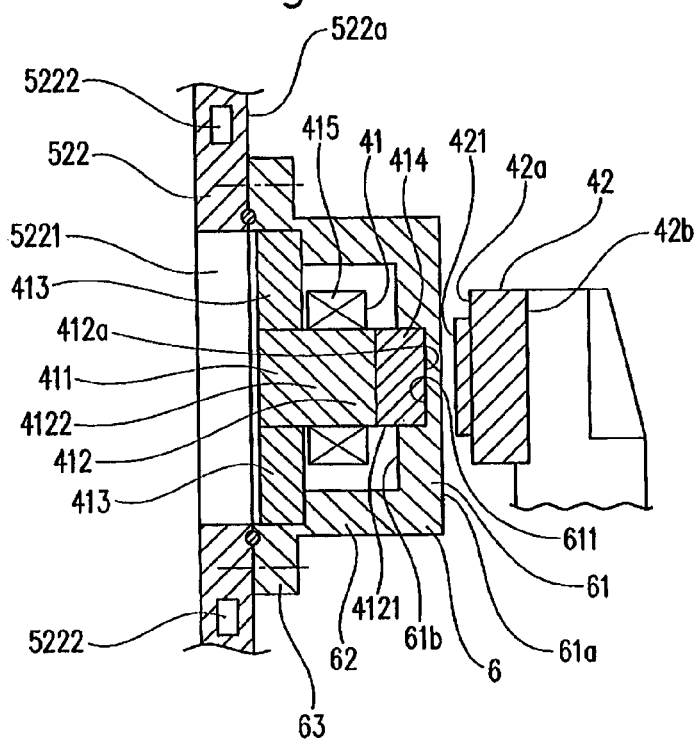

More specifically, as shown in FIGS. 2, 6(A) and 6(B), the first core 41 is placed inside the cover 6 and thus disposed inside the placing section 3. That is, the coils 415 are placed in the atmospheric area inside the cover 6, that is, inside the placing section 3, and furthermore the permanent magnets 414 are also placed therein. On the other hand, the second core 42 is mounted to a mounting flange disposed inside the vacuum section 2 which is outward of the cover 6. That is, only the metal having a magnetic property as the second core 42 (specifically, surface treated iron) is disposed in the vacuum area that is outside the placing section 3 and inside the vacuum section 2.

Here, the first core 41 is installed in such a direction as to have the longitudinal direction of the yoke 411 oriented in the front and back direction and the projecting direction of the magnetic poles 412 oriented in the lateral direction (right and left direction), and specifically oriented outward in the lateral direction (right and left direction). On the other hand, the second core 42 is installed in such a direction as to have the longitudinal direction thereof oriented in the front and back direction and the projecting direction of the projections 421 oriented in a direction opposite to the magnetic poles 412, and specifically oriented inward in the lateral direction (right and left direction). As such, the first core 41 and the second core 42 are disposed so as to laterally oppose each other.

Between the first core 41 and the second core 42 is interposed a bottom wall 61 of the cover 6, that is, a non-magnetic plate shaped body. Specifically, the first core 41 is disposed on the side of the inner surface 61*b* of the bottom wall 61 and the second core 42 is disposed on the outer side thereof. The leading ends 4121 of the magnetic poles 412 of the first core 41 are fittingly engaged with the recesses 611 of the bottom wall 61. On the other hand, the coils 415 and the inner surface 61*b* of the bottom wall 61 are spaced apart from each other with a clearance therebetween. The projections 421 of the second core 42 and the outer surface 61*a* of the bottom wall 61 are spaced away from each other with a clearance therebetween. In this embodiment, the leading end surfaces 412*a* of the magnetic poles 412 are held in abutting engagement with the bottom surface of the recesses 611, but a clearance may be provided between the leading end surfaces 412*a* and the bottom surface.

The linear motors 4 are provided in pair on the lateral sides (right and left sides) relative to the front and back direction, which is the traveling direction of the placing section 3, so as to laterally oppose each other. Specifically, the linear motors 4 are respectively provided one by one on the lateral side walls 522 of the narrow portion 52. In this embodiment, the linear motors 4 are wired motors, in which the wires of the linear motors 4 are passed through the inside of the placing section 3 and the inside of the communication section 7, and drawn out to the outside the vacuum section 2. Power feeding system to the linear motors 4 are not limited to the wired system and may be the wireless system.

Now, the description will be made for the operation of the vacuum processing apparatus 1 having the above structure. With the inside the vacuum section 2 held in vacuum and the inside the placing section 3 filled with air, the coils 415 of the linear motors 4 are powered to generate magnetic flux from the coils 415. This magnetic flux is guided to the permanent magnets 414 and transmitted from the first core 41 to the second core 42, and then returned from the second core 42 to the first core 41 to thereby form a magnetic flux loop. Accordingly, thrust is generated against the first core 41 in the longitudinal direction of the second core 42 (i.e., in the front and back direction), and this thrust allows the placing section 3 to travel inside the vacuum section 2 while being guided by the rails 23 disposed along the traveling path. For example, when a film forming process is to be applied to a workpiece, this process is made in the course of the travel of the placing section 3 by using a non-illustrated film forming device or the like.

In the vacuum processing apparatus 1 having the above structure, the first core 41 having the coils 415 are placed inside the cover 6, so that heat generated from the coils 415 is not released to the inside the vacuum section 2 held in vacuum, but released to the air inside the placing section 3. For example, when an insulating varnish or protection mold is provided on the coils 415, gas generated from the varnish or mold is released to the air inside the placing section 3, as well. Therefore, no adverse effect is caused to the workpiece placed on the placing section 3, and the inside the vacuum section 2 can be held in stable vacuum conditions.

The first core 41 is mounted to the inside the placing section 3 placed inside the cover 6, and therefore travels along with the placing section 3. As such, it is not necessary to provide a large number of the first cores 41 along the entire traveling path of the placing section 3 unlike the prior art, and therefore the number of the first cores 41 (especially the coils 415) to be installed can be suppressed and hence the costs for it can be suppressed. Since the coils 415 of the first core 41 travel along the placing section 3, easy control for electric current to be fed to the coils 415 can be achieved.

In addition, since the first core 41 disposed in the air inside the placing section 3 includes not only the coils 415 but also the permanent magnets 414, it is possible to prevent not only heat generated from the coils 415 but also gas generated from the permanent magnets 414 from being released into the vacuum area.

Furthermore, since the second core 42 disposed in the vacuum area which is outside the placing section 3 and inside the vacuum section 2 is made of only the metal having a magnetic property subjected to electroless nickel plating, it is possible to prevent corrosion or rust of the second core 42, as well as effectively suppress generation of gas.

Furthermore, since the side walls 522 of the narrow portion 52 have the fluid passages 5222 for distribution of cooling liquid, respectively, the coils 415 can be effectively cooled by flowing cooling liquid into the fluid passages 5222. Heat generated from the coils 415 is transmitted through the covers 6 to the side walls 522 of the narrow portion 52.

Since both the lateral (right and left sided) linear motors 4 are installed to be placed within the range of the lateral width W2 of the wide portion 51, it is possible to achieve the compactness. Also, there is an advantageous effect in that a film is hardly adhered onto the covers 6 or the second core 42 when in film forming.

Furthermore, since the first core 41 and the second core 42 are disposed to laterally oppose each other, an attraction force acting between the permanent magnets 414 of the first core 41 and the second core 42 acts in the lateral (right and left) direction which is a direction crossing the direction of the gravity (i.e., the vertically downward direction), which acts on the placing section 3. Thus, the gravity direction component of this attraction force can be reduced, and the load applied to the rails 23 can be reduced so that durability can be increased. It is also possible to effectively suppress generation of particles, such as dust or coarse particulate.

In addition, since the linear motors 4 are provided in pair so as to laterally oppose each other relative to the front and back direction (traveling direction of the placing section 3), the attraction force acting on one of the linear motors 4 and the attraction force acing on the other linear motor 4 act in the opposite directions along the lateral axis. Thus, the attraction forces acting on the linear motors 4 respectively are balanced out and eliminated. That is, the resultant of the attraction forces acting on the respective linear motors 4 becomes zero. Therefore, it is possible to reduce the load applied to the rails 23 and easily balance the forces acting on the placing section 3 and hence stably make the placing section 3 travel.

Since the lateral (right and left sided) rails 23 are disposed corresponding to both the lateral (right and left) ends of the placing surface 511a, it is possible to make the placing section 3 travel while making the placing surface 511a stable in horizontal position.

Still furthermore, since the communication sections 7 are provided so as to communicate between the atmospheric area outside the vacuum section 2 and the inside the placing section 3, heat or gas generated from the first core 41 disposed inside the placing section 3 can be effectively released to the atmospheric area outside the vacuum section 2 through the communication sections 7. Alternatively, the coils 415 of the first core 41 can be cooled from the outside the vacuum section 2, and increase in temperature of the inside the placing section 3 or temperature of the coils 415 can be effectively suppressed. For example, when the coils 415 are provided with the varnish or mold, gas generated from the varnish or mold can be released to the atmospheric area outside the vacuum section 2 through the communication sections 7.

Furthermore, the communication sections 7 are disposed on the lateral sides (right and left sides) relative to the traveling path of the placing section 3. For example, when the communication sections 7 are disposed on the front side or back side of the placing section 3, the permissible traveling range of the placing section 3 within the vacuum section 2 is limited by the amount of the length in the front and back direction of the communication sections 7. However, with the arrangement in which the communication sections 7 are disposed on the lateral sides relative to the traveling path of the placing section 3 as in this embodiment, such limitation can be eliminated. That is, it is possible to make the placing section 3 travel along the entire length in the front and back direction of the vacuum section 2. Therefore, it is possible to achieve the compactness of the vacuum section 2.

Still furthermore, since the communication sections 7 are disposed on both the lateral sides (right and left sides) of the traveling path, it is possible to make the air flow from, for example, the left communication section 7 through the inside the placing section 3 to the right communication section 7, and hence effectively process heat or gas generated inside the placing section 3.

Figure 7A:
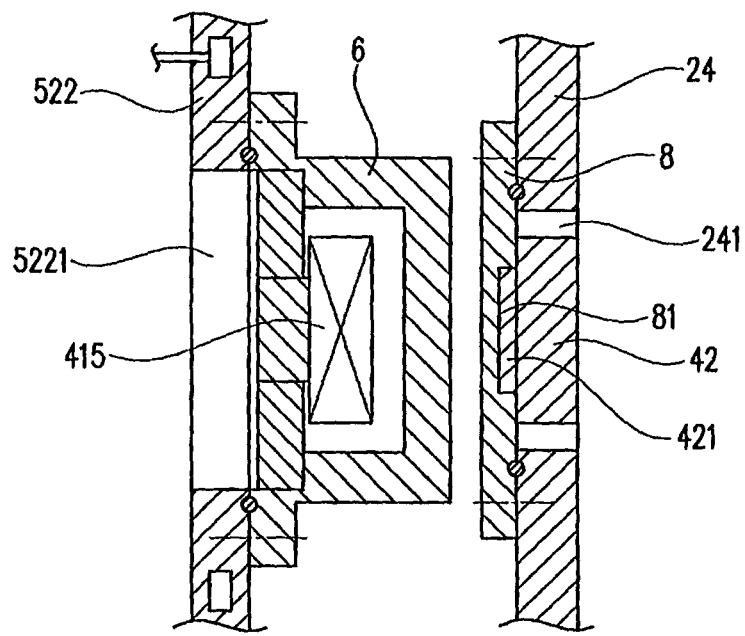
FIG. 7(A) is a cross sectional view showing the arrangement of a coil and FIG. 7B is a cross sectional view showing the arrangement of a magnetic pole.
Figure 7B:
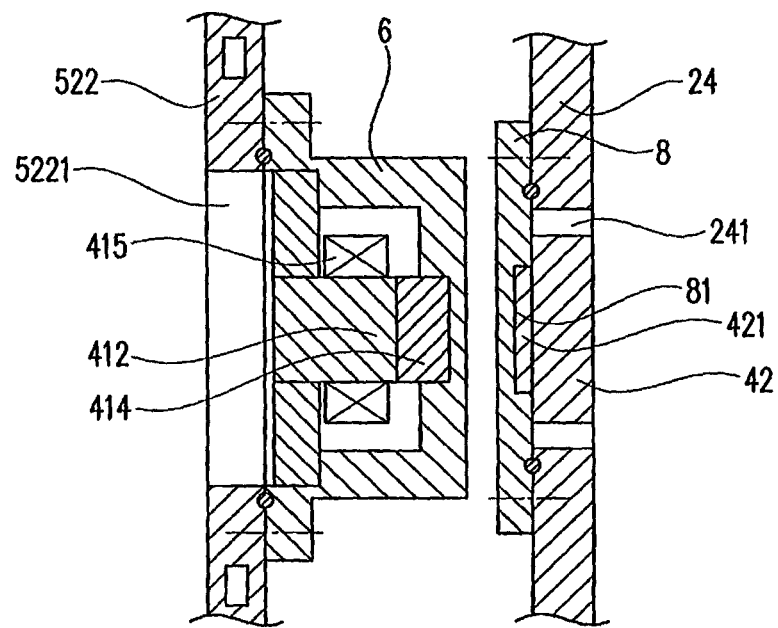

This embodiment was described by taking, for example, the case where the second core 42 is disposed inside the vacuum section 2 and outside the placing section 3, without intention to limit thereto, and therefore the second core 42 can be disposed outside the vacuum section 2. Specifically, as shown in FIGS. 7(A) and 7(B), lateral side walls 24 of the vacuum section 2 are structured to have their portions coming close to the side walls 522 of the narrow portion 52, and installation holes 241 are bored in the lateral side walls 24 of the vacuum section 2. Closing plates 8 are mounted to the inside surfaces of the side walls 24 of the vacuum section 2 to cover the installation holes 241, thereby isolating the vacuum area on the inner surface sides of the closing plates 8 from the atmospheric area on the outer surface sides of the same. Then, each second core 42 is fitted into the area surrounded by the installation hole 241 and the closing plate 8. A recessed portion 81 is formed by recessing the outer surface of the closing plate 8, and the projections 421 of the second core 42 are fittingly engaged with the recessed portion 81 to bring the projections 421 closer to the magnetic poles 412 of the first core 41, which is suitable.

Figure 8:
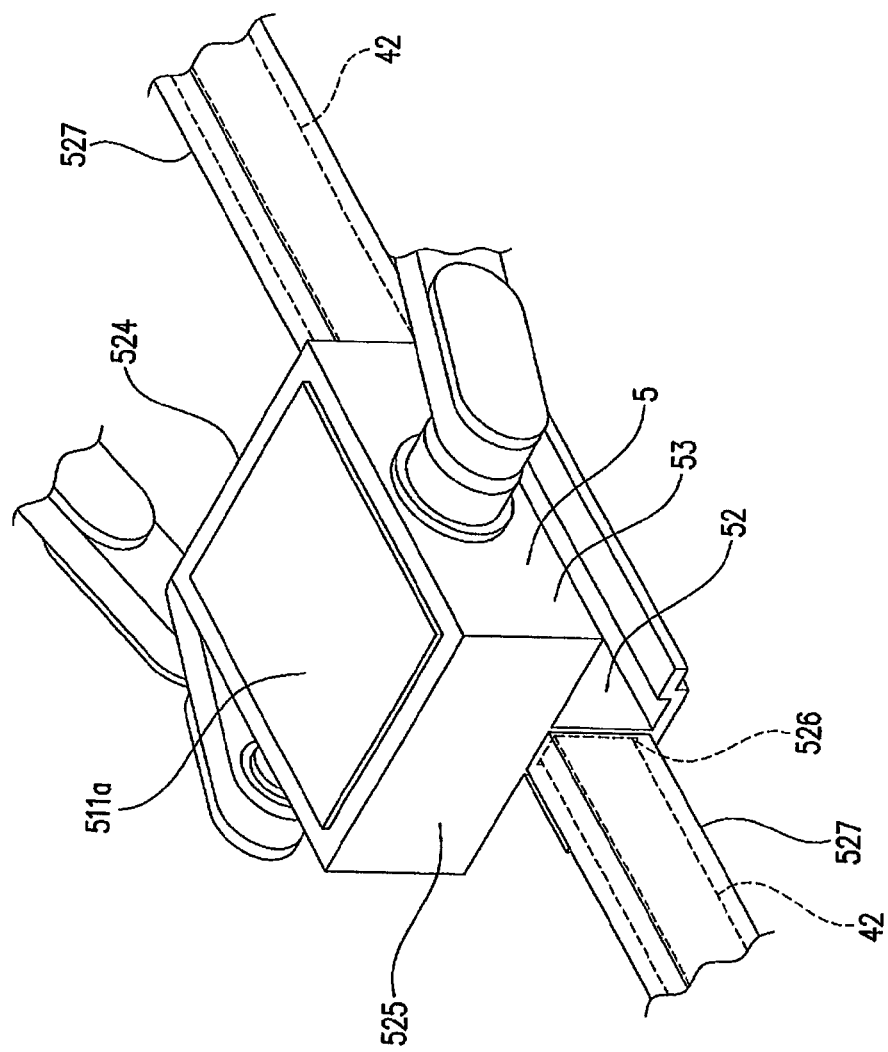
FIG. 8 is a perspective view showing another embodiment relating to the mounting manner of the second core of the linear motor.

Alternatively, the second core 42 may be disposed inside the placing section 3. Specifically, as shown in FIG. 8, installation holes 526 are bored in a front wall 524 and a back wall 525 of the narrow portion 52, respectively. Then, a bellows 527 which is expandable and contractible in the front and back direction is straddled between the front wall 524 of the narrow portion 52 and the front wall 524 of the vacuum section 2 to cover the front installation hole 526, and a bellows 527 which is expandable and contractible in the front and back direction is straddled between the back wall 525 of the narrow portion 52 and the back wall 525 of the vacuum section 2 to cover the back installation hole 526. This arrangement achieves communication between the inside the bellows 527 and the inside the placing body 5 through the installation holes 526, while air is placed in these inside spaces and these inside spaces are isolated from the inside the vacuum section 2. The second core 42 is disposed through both the front and back installation holes 526 so as to extend over from the front end of the inside of the front bellows 527 and the back end of the inside of the back bellows 527. In FIG. 8, the vacuum section 2 is omitted.

Furthermore, this embodiment was described by taking, for example, the case where the linear motors 4 are provided in pair on the lateral sides (right and left sides) without intention to limit thereto, and therefore three or more motors or only a single motor may be provided.

Furthermore, this embodiment was described by taking, for example, the case where the attraction force of the permanent magnets 414 of the linear motors 4 act in the lateral (right and left) direction, without intention to limit thereto, and therefore it may act in vertically downward direction or vertically upward direction.

Still furthermore, this embodiment was described by taking, for example, the case where the pair of linear motors 4 are disposed so as to laterally oppose each other, without intention to limit thereto, and therefore they may be disposed so as to vertically oppose each other or diagonally oppose each other.

Yet furthermore, this embodiment was described by taking, for example, the case where the first core 41 and the second core 42 are disposed so as to laterally oppose each other, without intention to limit thereto, and therefore they may be disposed so as to vertically oppose each other or diagonally oppose each other.

Furthermore, this embodiment was described by taking, for example, the case where the resultant of the attraction forces acting on the respective linear motors 4 becomes zero, without intention to limit thereto, and therefore the case where the resultant of the attraction forces does not become zero to allow an attraction force to act either in the vertical direction or lateral direction.

Furthermore, this embodiment was described by taking, for example, the case where the linear motors 4 are provided in the narrow portion 52, without intention to limit thereto, and therefore they may be disposed in the wide portion 51. In this case, it is possible to eliminate the narrow portion 52 and form only the wide portion 51 in the placing body 5.

Still furthermore, this embodiment was described by taking, for example, the case where the linear motors 4 are guided threaded-type linear motors, that is, the coils 415 and the permanent magnets 414 are provided in the first core 41, without intention to limit thereto, and therefore the linear motors are not necessarily limited to a specific kind. For example, the linear motors 4 may be permanent magnet type linear motors, that is, have an arrangement where the coils 415 are disposed in the first core 41 and the permanent magnets 414 are disposed in the second core 42.

Yet furthermore, this embodiment was described by taking, for example, the case where the communication sections 7 are disposed in pair on the lateral sides (right and left sides) relative to the traveling path of the placing section 3, without intention to limit thereto, and therefore they may be disposed only on any of the lateral sides. Or, they may be disposed below the placing section 3.

Still furthermore, this embodiment was described by taking, for example, the case where the first arm 71 and the second arm 72 are pivotally moved along the vertical plane parallel to the front and back direction, without intention to limit thereto, and therefore they may be pivotally moved in the front and back direction along the horizontal plane.

Furthermore, this embodiment was described by taking, for example, the case where the extendable multiple joint arm ducts each having plural joints are used for the communication sections 7, without intention to limit thereto, and therefore bellows may be used for them.

Still furthermore, this embodiment was described by taking, for example, the case where the fluid passages 5222, which enables cooling medium to flow into the side walls 522 of the narrow portion 52, without intention to limit thereto, and therefore it is possible to employ an arrangement to eliminate the fluid passages 5222 and flow cooling blows of air into the inside the placing section 3. In this case, a fan for flowing blows of air into the inside the placing section 3 may be properly disposed.

Yet furthermore, this embodiment was described by taking, for example, the case where the covers 6 are mounted to the placing body 5 and the first core 41 is placed inside each cover 6, without intention to limit thereto, and therefore it is possible to employ an arrangement to eliminate the covers 6 and directly mount the first core 41 to the placing body 5.

DESCRIPTION OF THE REFERENCE NUMERALS

1: vacuum processing apparatus, 2: vacuum section, 3: placing section, 4: linear motor, 5: placing body, 6: cover, 7: communication section, 8: closing plate, 22: first communication hole, 23: rail, 41: first core, 42: second core, 51: wide portion, 52: narrow portion, 61: bottom wall, 61a: outer surface of the bottom wall, 61b: inner surface of the bottom wall, 62: outer wall, 63: flange, 71: first arm, 72: second arm, 73: third arm, 74: arm coupling part, 411: yoke, 412: magnetic pole, 412a: leading end surface of the magnetic pole, 413: support part, 414: permanent magnet, 415: coil, 421: projection, 511a: placing surface, 523: rail engaging portion, 527: bellows, 611: recess, 5121: through-hole, 5131: second communication hole, 5221: mounting hole, 5222: fluid passage, W1: lateral spacing distance between the lateral rails, W2: lateral width of the wide portion, W3: lateral width of the narrow portion

The invention claimed is:

1. A vacuum processing apparatus comprising a vacuum section of which inside is held in vacuum, a placing section that is disposed inside the vacuum section and is capable of placing a workpiece thereon, a linear motor that includes coils and a permanent magnet and makes the placing section travel within the vacuum section, and rails that support the placing section and guide the placing section along a traveling path thereof, wherein air is placed inside the placing section while being isolated from the vacuum section, the coils of the linear motor are disposed inside the placing section, and the linear motor is disposed so that the attraction force of the permanent magnet acts in a direction crossing the direction of the gravity acting on the placing section.

2. The vacuum processing apparatus according to claim 1, wherein the placing section includes a placing body that has a placing surface for placing the workpiece thereon and a cover that is mounted to the placing body so as to project outward from the placing body, and the coils are housed inside the cover.

3. The vacuum processing apparatus according to claim 1, wherein the cover is made of a non-magnetic material.

4. The vacuum processing apparatus according to claim 1, wherein the placing section includes a placing body that has a placing surface on which the workpiece is placed; the placing body has a wide portion that has a top surface acting as the placing surface and a narrow portion that projects downward from a bottom surface of the wide portion and has a lateral width smaller than the lateral width of the wide portion; the linear motor is provided in pair corresponding to the lateral side surfaces of the narrow portion; and both the pair of linear motors are placed within the range of the lateral width of the wide portion.

5. The vacuum processing apparatus according claim 1, further comprising rails that support the placing section and guide the placing section along a traveling path thereof, wherein the linear motor is provided in plural, each of the linear motors having a permanent magnet, and the linear motors are disposed so that the attraction forces of the permanent magnets of the linear motors are balanced out and eliminated.

6. The vacuum processing apparatus according to claim 5, wherein the linear motor includes a first core that has the coils and a second core that is disposed along the traveling path of the placing section; any one of the first core and the second core has a permanent magnet; the linear motor is disposed so that the first core and the second core laterally oppose each other; and the linear motor is provided in pair to laterally oppose each other relative to the traveling direction.

7. The vacuum processing apparatus according to claim 1, wherein an area outside the vacuum section is an atmospheric area, and a communication section is provided to communicate between the atmospheric area and the inside the placing section.

8. The vacuum processing apparatus according to claim 7, wherein the communication section is provided on any one or both of the lateral sides relative to the traveling path of the placing section.

9. The vacuum processing apparatus according to claim 7, wherein the communication section is an extendable multiple joint arm duct that extends and contracts in the traveling direction of the placing section and that extends and contracts in the traveling direction of the placing section by extension and contraction of joints in association with the travel of the placing section.

* * * * *